United States Patent
Goellner et al.

(10) Patent No.: US 8,535,993 B2
(45) Date of Patent: Sep. 17, 2013

(54) SEMICONDUCTOR DEVICE AND METHOD USING A SACRIFICIAL LAYER

(75) Inventors: Reinhard Goellner, Regensburg (DE); Rudolf Berger, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 357 days.

(21) Appl. No.: 12/884,900

(22) Filed: Sep. 17, 2010

(65) Prior Publication Data
US 2012/0068240 A1    Mar. 22, 2012

(51) Int. Cl.
*H01L 21/335*    (2006.01)

(52) U.S. Cl.
USPC ........................... 438/142; 438/257

(58) Field of Classification Search
USPC .................................. 438/142, 257
See application file for complete search history.

(56) References Cited

U.S. PATENT DOCUMENTS

| | | | |
|---|---|---|---|
| 5,756,384 A * | 5/1998 | Tseng | 438/257 |
| 6,423,384 B1 | 7/2002 | Khazeni et al. | |
| 2005/0003308 A1 | 1/2005 | Frohlich et al. | |
| 2008/0280431 A1 * | 11/2008 | Jung et al. | 438/593 |
| 2011/0217839 A1 | 9/2011 | Engelhardt et al. | |

FOREIGN PATENT DOCUMENTS

| | | |
|---|---|---|
| DE | 10-2010-037434 A1 | 3/2011 |
| DE | 10-2008-001005 B4 | 6/2011 |
| KR | 10-2010-0108715 A | 10/2010 |

* cited by examiner

*Primary Examiner* — Jae Lee
(74) *Attorney, Agent, or Firm* — Slater & Matsil, L.L.P.

(57) ABSTRACT

A method of manufacturing a semiconductor device is disclosed. The method includes forming a first conductive layer over a substrate. The first conductive layer has a top surface and sidewalls, wherein the first conductive layer comprises an overhang of a non-conductive material along the sidewalls. The method further includes forming an insulating layer on the first conductive layer, and forming a sacrificial layer over the insulating layer and the overhang of the first conductive layer. The sacrificial layer is partially removed wherein a residue of the sacrificial layer remains beneath the overhang, and a second conductive layer is formed on the insulating layer.

17 Claims, 3 Drawing Sheets

SEMICONDUCTOR DEVICE AND METHOD USING A SACRIFICIAL LAYER

TECHNICAL FIELD

The present invention relates to a method of manufacturing a semiconductor device and in particular to a method of manufacturing logic and memory devices. The present invention also relates to a semiconductor device.

BACKGROUND

Typically, semiconductor devices are fabricated by depositing, etching and planarizing different material layers over one another.

In some deposition processes the deposition of a material layer may form an overhang along sidewalls and/or over the top surface of the material layer. There are several known methods to avoid or to remove undesired formations of overhangs prior to the deposition of subsequent material layers.

One known method avoids such overhangs by providing an additional semiconductor manufacturing step such as the application of tetra-ethyl-ortho-silicate (TEOS) spacers. Another known method removes unwanted materials under overhangs by an etch process which is less anisotropic and more isotropic. However, such an approach creates other disadvantages such as less control of line widths.

SUMMARY OF THE INVENTION

In accordance with an embodiment of the present invention, a method of manufacturing a semiconductor device includes forming a first conductive layer over a substrate, the first conductive layer having a top surface and sidewalls wherein the first conductive layer comprises an overhang of a non-conductive material along the sidewalls, forming an insulating layer on the first conductive layer, and forming a sacrificial layer over the insulating layer and the overhang of the first conductive layer. The sacrificial layer is partially removed wherein a residue of the sacrificial layer remains beneath the overhang, and a second conductive layer is disposed on the insulating layer.

The foregoing has outlined rather broadly the features and technical advantages of embodiments of the present invention in order that the detailed description of the invention that follows may be better understood. Additional features and advantages of embodiments of the invention will be descried hereinafter, which form the subject of the claims of the invention. It should be appreciated by those skilled in the art that the conception and specific embodiments disclosed may be readily utilized as a basis for modifying or designing other structures or processes for carrying out the same purpose of the present invention. It should be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a method of making a capacitor and EEPROMs. The invention may also be applied, however, to other methods of making logic and memory devices where two conductive layers are deposited on top of one another.

Figure 1:
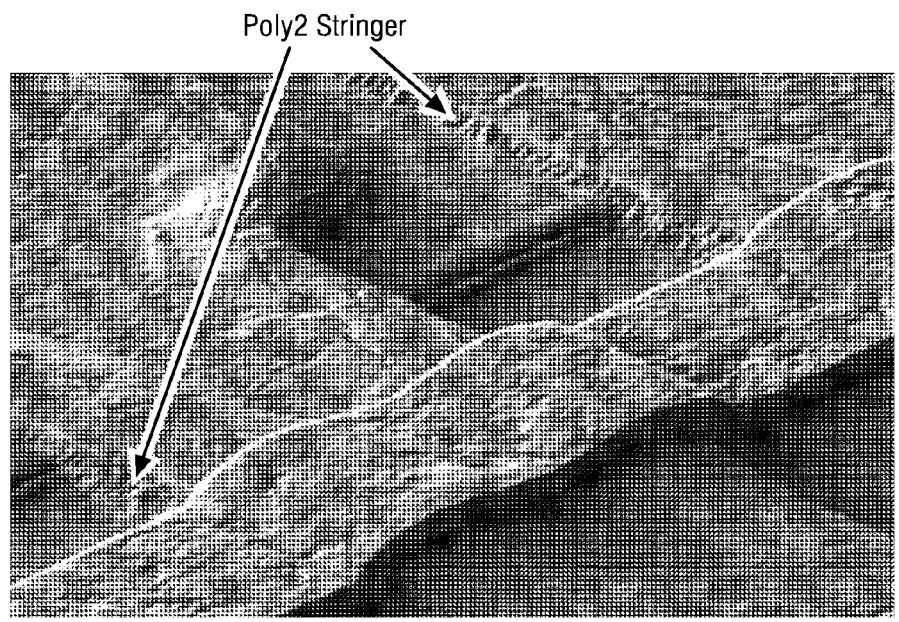
FIG. 1 shows a SEM image of poly-silicon lines.

FIG. 1 shows a SEM image of poly-silicon lines. The SEM image shows poly-silicon (poly 2) stringer along the poly-silicon lines. The poly 2 stringers may form because of an overhang which is created by an oxidation of poly-silicon (poly 1) lines. The oxidation of the poly 1 creates an overhang having an opening underneath it. Deposition and removal of a poly 2 layer over the poly 1 lines and the substrate may result in poly 2 material residue in the opening underneath the overhang. The poly 2 material residue in the opening underneath the overhang may create poly 1-poly 2 shorts in the resulting device.

Embodiments of the present invention may provide advantages including a process for manufacturing semiconductor devices which may not have any residue of material or stringers in the openings underneath the overhangs. Embodiments of the present invention therefore may provide more reliable devices than conventionally manufactured semiconductor devices.

In one embodiment, the semiconductor process provides a reliable low cost process for manufacturing semiconductor devices such as capacitors and EEPROMs. In one embodiment, the semiconductor manufacturing process prevents the deposition of materials in openings under overhangs. In another embodiment, the semiconductor manufacturing process provides a deposition of a sacrificial layer into the openings under the overhangs. In yet another embodiment, the semiconductor manufacturing process provides a replacement of the sacrificial material in the opening under the overhang with an insulating material.

In one embodiment, a sacrificial layer may be applied which has high etch selectivity compared to other materials typically used in semiconductor manufacturing such as metals, poly-silicon, silicon oxides, silicon nitrides, high-k oxides or high-k nitrides such as $HfO_2$, $Si_3N_4$, $Al_2O_3$, $Ta_2O_5$, $ZrO_2$. In one embodiment the sacrificial layer may partially removed in an anisotropic etch process and the remains of the sacrificial layer may be partially or completely removed in an isotropic etch process. In one embodiment the sacrificial layer is a carbon containing layer. Etch chemistries for the anisotropic and the isotropic etch of the sacrificial layer may be an oxygen containing gas chemistry, a hydrogen containing gas chemistry, or both an oxygen and hydrogen containing gas chemistry.

Figure 2:
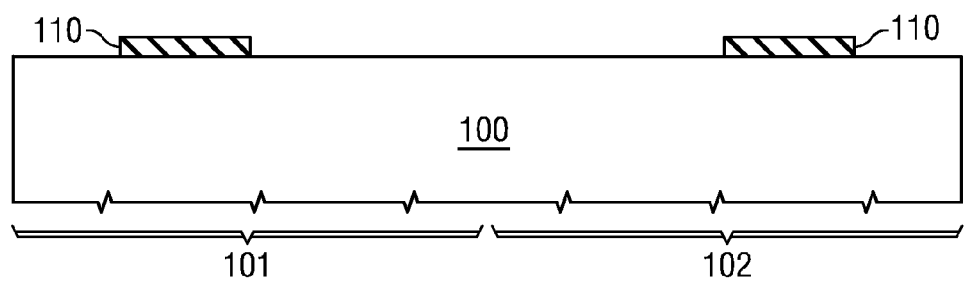
FIG. 2 illustrates a cross-sectional view of first insulation layers.

FIG. 2 shows a substrate 100 having a first region 101 and a second region 102. A first memory device will be manufactured in the first region 101 and a second memory device will be manufactured in the second region 102. The substrate 100 may comprise bulk silicon or silicon on insulator (SOI). Alternatively, the substrate 100 may be a compound semiconductor such as SiGe. A first insulating layer 110, e.g., a dielectric layer, may be selectively formed over the first region 101 and over the second region 102. The dielectric layer 110 may be a high-k material or a silicon oxide. For example, the high-k dielectric may be SiON, $ZrO_2$, $HfO_2$, $Ta_2O_5$, $Al_2O_3$, $TiO_2$ or the like. In one embodiment the dielectric layer 110 may serve as gate oxide layer of a memory device such as an EEPROM. The first insulating layer 110 may be less than about 200 nm or, alternatively, less than about 5 nm thick.

Figure 3:
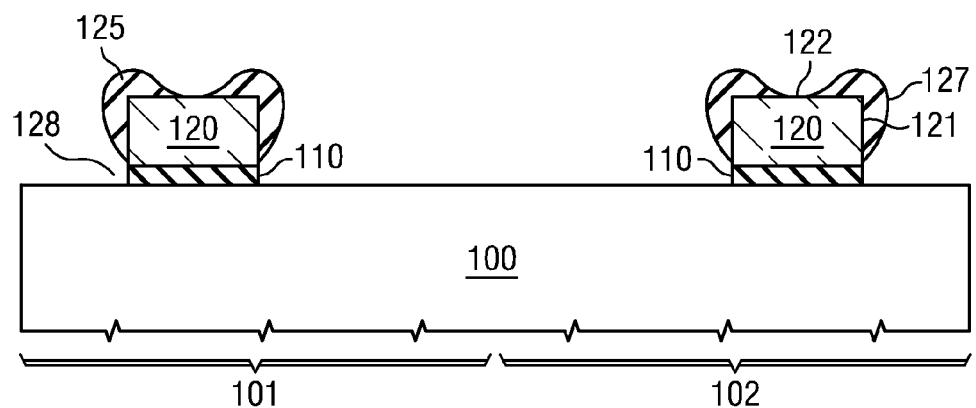
FIG. 3 illustrates a cross-sectional view of disposed first conductive lines having a non-conductive material on the top surface and along the sidewalls.

As shown in FIG. 3, a first conductive layer 120 is deposited over the first dielectric layer 110 in the first region 101 and over the first dielectric layer 110 in the second region 102. The first conductive layer 120 may be a polysilicon, a doped polysilicon, or a metal such as Cu, TiN, TaN, Ta, Ti, W, WSi or Al. The first conductive layer 120 may comprise the same or different materials in the first region 101 and the second region 102. The first conductive layer 120 may be less than about 1000 nm or, alternatively, less than about 20 nm thick.

The first conductive layer 120 has sidewalls 121 and a top surface 122. Under some process conditions a non-conductive material 125 may be formed along the sidewalls 121 of the first conductive layer 120 while or after the first conductive layer 120 is formed. Under other process conditions, the non-conductive material 125 may be formed not only along the sidewalls 121 of the first conductive layer 120 but also on a part or all of the top surface 122 of the first conductive layer 120. In one embodiment, the non-conductive material 125 may be an oxide and may be in particular a silicon oxide. The silicon oxide may be formed in a thermal oxidation process. For example, silicon oxide may be formed by $Si+O_2 \Rightarrow SiO_2$ or by $Si+2H_2O \Rightarrow SiO_2+2H_2$.

In one embodiment, the non-conductive material 125 forms an overhang 127. The non-conductive material 125 may be thicker on a sidewall 121 region closer to the top surface 122 of the conductive layer 120 and thinner on a sidewall 121 region closer to bottom of the conductive layer 120 near the first insulation layer 110. The overhang 127 may not cover the sidewalls 121 of the conductive layer 120 at a bottom region of the sidewalls 121. A distance d of the overhang 127 may be less than about 500 nm, less than about 200 nm or less than about 20 nm. In one embodiment, the non-conductive material 125 is thicker on the top surface 122 in a region closer to the sidewalls 121 than in a region towards the middle of top surface 122. As can be seen from FIG. 3, openings 128 may be formed underneath the overhangs 127.

In an embodiment, the first conductive layer 120 may serve as a lower electrode plate of a capacitor. In another embodiment, the first conductive layer 120 may be a floating gate of an EEPROM.

The source/drain regions may be formed in the first region 101 and in the second region 102. The source/drain regions may be formed after the first conductive layer 120 is formed. The source/drain regions may be formed adjacent to the first insulating layer 110 in the substrate 100. The source/drain regions may be doped using conventional implantation methods. The source/drain regions may be formed utilizing known techniques.

Figure 4:
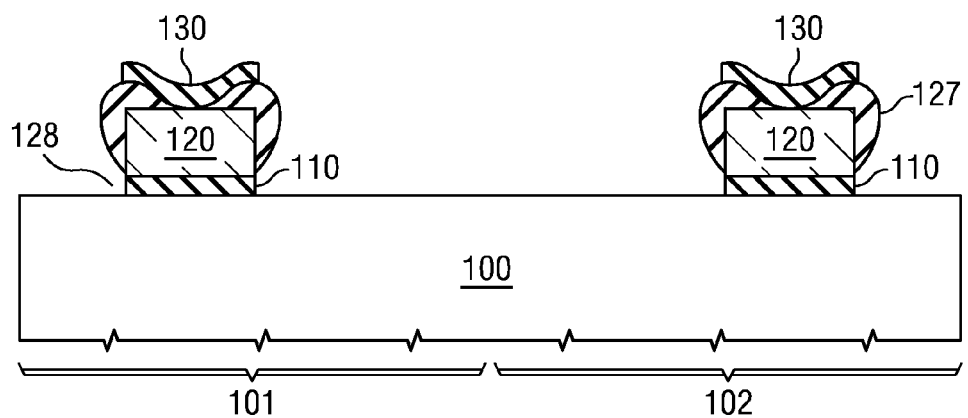
FIG. 4 illustrates a cross-sectional view of disposed dielectric layers.

FIG. 4 shows a second insulating layer 130. The second insluting layer 130 may comprise a dielectric layer, deposited on the top surface 122 of the first conductive layer 120. The dielectric layer 130 may comprise a high-k dielectric material such as SiON, $ZrO_2$, $HfO_2$, $Ta_2O_5$, $Al_2O_3$, $TiO_2$ or the like, or a silicon oxide ($SiO_2$). In one embodiment, the dielectric layer 130 comprises a plurality of layers. For example, the dielectric layer 130 may have an oxide nitride oxide (ONO) structure. In one embodiment the dielectric layer 130 may be directly disposed over the first conductive layer 120. In one embodiment the dielectric layer 130 may be directly disposed over the first conductive layer 120 and may also be directly disposed over the non-conductive material 125.

The dielectric layer 130 may have a thickness of less than about 50 nm or, alternatively, less than about 3 nm. In one embodiment the dielectric layer 130 may serve as a capacitor dielectric of a capacitor or as a tunnel dielectric between a floating gate and a control gate of an EEPROM.

Figure 5:
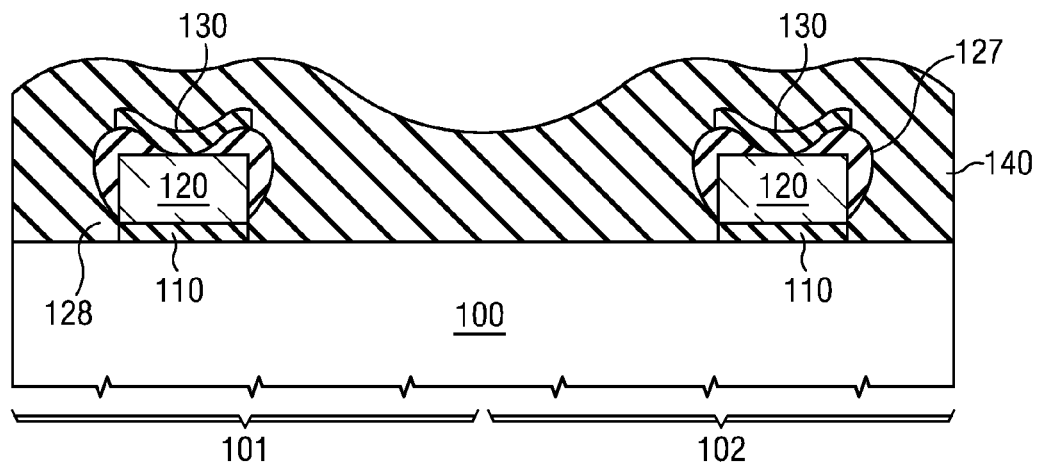
FIG. 5 illustrate a cross-sectional view after deposition of a sacrificial layer.

FIG. 5 shows the deposition of a sacrificial layer 140. The sacrificial layer 140 is deposited over the first and second regions 101, 102. In one embodiment the sacrificial layer 140 may be deposited using a conformal deposition technique over the first conductive layer 120 and the second dielectric layer 130 in one deposition step.

In one embodiment, the sacrificial layer 140 may comprise high selectivity compared to other commonly used materials in semiconductor manufacturing. For, example, the sacrificial layer 140 may have high selectivity to metals, poly-silicon, silicon oxides, and silicon nitrides, commonly used high-k gate materials for gate dielectrics or capacitor dielectrics.

In one embodiment the sacrificial layer 140 may be a carbon containing layer. The carbon containing layer may be carbon (C) or may comprise any other carbon containing material. The carbon containing layer may be formed from a carbon containing gas such as $CH_4$, $C_2H_6$, $C_2H_4$, $C_2H_2$ and $C_3H_6$, for example.

In one embodiment, the sacrificial layer 140 may be treated with an anisotropic etch step and subsequently may be treated with an isotropic etch step. In one embodiment, the sacrificial layer 140 may be partially removed in a first anisotropic etch step and may be further completely or partially removed in a second isotropic etch step. In one embodiment, the sacrificial layer 140 may be removed in an anisotropic etch process so that a residue 142 of the sacrificial layer 140 material may remain in an opening 128 under the overhang 127. The residue 142 of the sacrificial layer 140 may be at least partially removed with an isotropic etch process from the opening 128 under the overhang 127.

In one embodiment the carbon containing layer 140 may be deposited in a plasma enhanced chemical vapor deposition (PECVD) process. The PECVD process may form a carbon containing layer having an amorphous graphite like structure. In another embodiment the carbon containing layer may be formed by an high density plasma (HDP) process. The HDP process may form a carbon layer having a diamond-like structure. In yet another embodiment, a low dielectric constant (less than 3.0) amorphous carbon film is formed using high density plasma chemical vapor deposition (HDP-CVD).

In one embodiment, the carbon containing layer 140 may be deposited in a low temperature deposition process. Suitable temperatures for the low temperature deposition process may be about 10° C. to about 45° C.

In one embodiment, the thickness of the sacrificial layer 140 may depend on the thickness of the overhang 127. One approach may be the thicker the overhang 127 the thicker the sacrificial layer 140. For example, the sacrificial layer 140 may be about 1000 nm thick in one application but may be about 10 nm-20 nm thick in another application. In yet another embodiment, the sacrificial layer 140 may completely fill the space 128 underneath the overhang 127. The sacrificial layer 140 may have a flow fill property to fill the opening 128 between the overhang 127 and substrate 100 without forming any voids.

Figure 6:
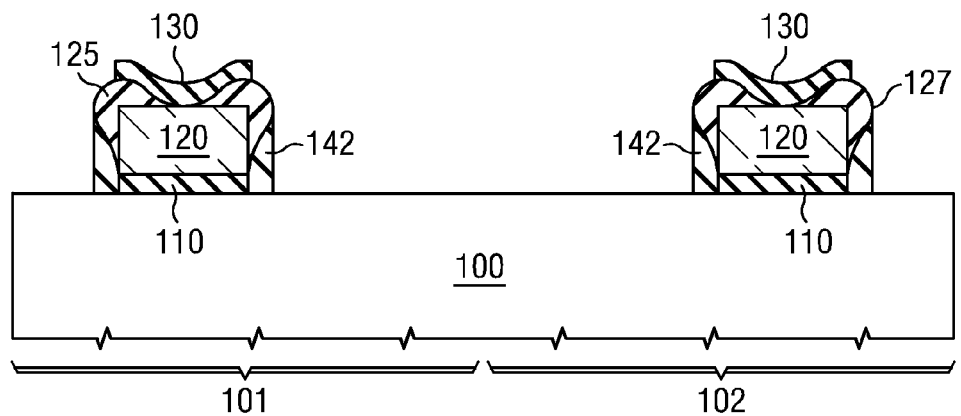
FIG. 6 illustrates a cross-sectional view after partial removal of the sacrificial layer.

FIG. 6 shows an anisotropic etch process of the sacrificial layer 140. The anisotropic etch process may partially remove the sacrificial layer 140 but may not remove the sacrificial layer 140 completely.

In one embodiment, the etch process may remove the sacrificial layer 140 over the dielectric layer 130. In another embodiment the etch process may remove the sacrificial layer 140 everywhere except in the openings 128 between the overhang 127 and the substrate 100. In yet another embodiment, the residue 142 of the sacrificial layer 140 may remain in the openings 128 under the overhang 127.

The residue 142 of the sacrificial layer 140 may form a sidewall substantially parallel to the distance d of the overhang 127. The residue 142 of the sacrificial layer 140 may form a sidewall, which is outward or convex tapered having a distance larger than the distance d of the overhang 127. The residue 142 of the sacrificial layer 140 may form a sidewall, which is inward or concave tapered having a distance shorter than the distance d of the overhang 127.

In one embodiment the anisotropic etch process is a plasma etch process such as a reactive ion etch process (RIE). The anisotropic etch process may be an etch process using ions in one direction and applying oxygen gas chemistries, hydrogen gas chemistries or a combination of hydrogen and oxygen gas chemistries. The anisotropic etch process may be an etch process using gas chemistries such as ammonia ($NH_3$) or carbon tetrafluorid ($CF_4$). The anisotropic removal of the sacrificial layer 140 may be selective to the dielectric layers 110, 130, the conductive layer 120 and the substrate 100.

Figure 7:
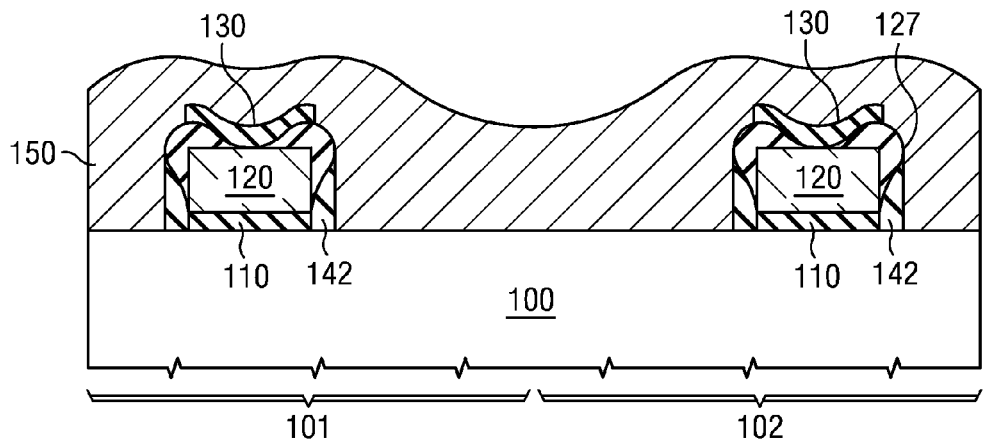
FIG. 7 illustrates a cross-sectional view after deposition of a second conductive layer.

After partially removing the sacrificial layer 140, a second conductive layer 150 may be deposited over the second dielectric layer 130. The second conductive layer 150 may be deposited conformal over the first layer stack in the first region 101, the substrate 100 and the second layer stack in the second region 102 as illustrated in FIG. 7. The second conductive layer 150 is disposed on the dielectric layer 130 in the first region 101 and the second conductive layer 150 is disposed on the dielectric layer 130 in the second region 102. The second conductive layer 150 may be polysilicon, doped polysilicon or a metal such as Cu, TiN, TaN, Ta, Ti, W, WSi or Al. The second conductive layer 150 may comprise the same or different materials in the first region 101 and the second region 102. The first insulating layer 110 may be less than about 1000 nm or, alternatively, less than about 20 nm thick. The second conductive layer 150 may form a top electrode of a capacitor or a control gate of an EEPROM.

In one embodiment the sacrificial layer 140 may prevent the formation of material of the second conductive layer 150 under the overhang 127. Since the second conductive layer 150 may comprise a conductive material the blocking of the openings 128 under the overhang 127 by the sacrificial layer 140 material may prevent possible shorts in a resulting device.

The second conductive layer 150 may be formed over the first layer stack in the first region 101 and the second layer stack in the second region 102. The second conductive layer 150 may be formed by depositing a photoresist and patterning the photoresist using known lithographic techniques. The patterned photoresist may remain over the first layer stack in the first region 101 and the second layer stack in the second region 102 so that portions outside of the first and second layer stacks of the second conductive layer 150 may be removed by an etch process. The etch process may be an anisotropic etch process such as an RIE. Etch chemistries used may comprise $CF_4$, hydrogen bromide (HBr), or chlorine ($Cl_2$). After the second conductive layer 150 is removed outside the first and second layer stacks the residue 142 of the sacrificial layer 140 in the openings 128 between the overhang 127 and the substrate 100 may be exposed.

Figure 8:
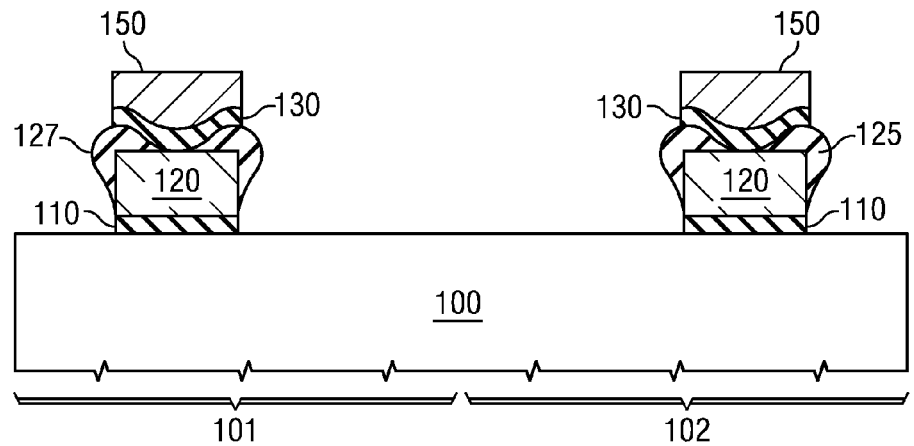
FIG. 8 illustrates a cross-sectional view after selective removal of the second conductive layer.

As shown in FIG. 8, the residue 142 of the sacrificial layer 140 in the opening 128 between the overhang 127 and the substrate 100 may be removed by an isotropic etch. The isotropic etch process may be an etch process applying oxygen gas chemistries, hydrogen gas chemistries or a combination of hydrogen and oxygen gas chemistries. For example, the removal of the residue 142 of the sacrificial layer 140 may be achieved by combustion. The removal of the residue 142 of the sacrificial layer 140 in the opening 128 between the overhang 127 and the substrate 100 may leave behind voids.

In one embodiment the sacrificial layer 140 may be partially removed in the openings 128 under the overhang 127. In one embodiment the sacrificial layer 140 may be completely removed in the openings 128 under the overhang 127.

Figure 9:
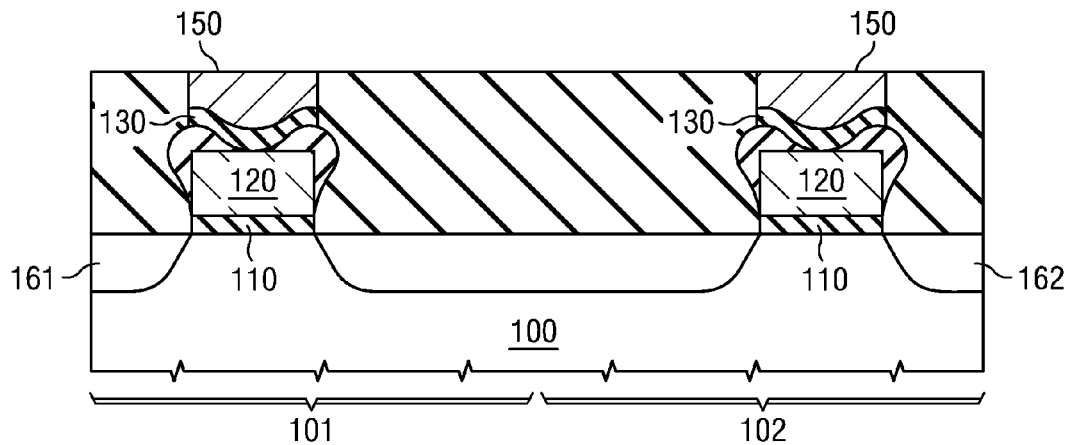
FIG. 9 illustrates a cross sectional view after depositing an interlayer dielectric.

FIG. 9 illustrates the deposition of an interlayer insulating material 170. The interlayer insulating material 170 may be deposited over the first layer stack in the first region 101 and the second layer stack in the second region 102 and may also fill the region between the first layer stack and the second layer stack thereby filling the openings 128 underneath the overhang 127. The interlayer insulating material 170 may be deposited by a sub-atmospheric CVD (SACVD), or, alternatively, by a PECVD.

The interlayer insulating material 170 may serve as an interlayer dielectric (ILD). The interlayer dielectric material 170 may be a silicon oxide, a fluorinated silicate glass (FSG), or a low-k material such as SiLK™, Flare™, SiCOH, Cora™, Black Diamond™, and a porous low dielectric constant material. The interlayer layer dielectric 170 may then be planarized using for example a chemical mechanical planarization (CMP) technique. Alternatively, the interlayer insulating material 170 may be a flowable material so that it is self-planarizing.

FIG. 9 shows the completion of an EEPROM device. An n-channel EEPROM may be formed by a highly n-type doped source/drain regions 180. A p-channel EEPROM may be formed by a highly p-type doped source/drain regions 180.

Although the present invention and its advantages have been described in detail, it should be understood that various changes, substitutions and alterations can be made herein without departing from the spirit and scope of the invention as defined by the appended claims. For example, many of the features and functions discussed above can be implemented in a capacitor manufacturing process having a lower electrode, a dielectric and an upper electrode. As another example, it will be readily understood by those skilled in the art that the novel process steps may be applied to any structure which has two conductive layers next to one another and that the process steps may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    forming a first conductive layer over a substrate, the first conductive layer having a top surface and sidewalls, wherein the first conductive layer comprises an overhang of a non-conductive material along the sidewalls;
    forming an insulating layer on the first conductive layer;
    forming a sacrificial layer over the insulating layer and the overhang;
    removing the sacrificial layer over the top surface of the first conductive layer such that a residue of the sacrificial layer remains under the overhang; and
    forming a second conductive layer on the insulating layer.

2. The method according to claim 1, wherein the sacrificial layer comprises a carbon containing layer.

3. The method according to claim 2, wherein the carbon containing layer is a carbon (C) layer.

4. The method according to claim 3, wherein forming the second conductive layer comprises forming the second conductive layer over the insulating layer, the overhang of the first conductive layer and the residue of the sacrificial layer, and selectively removing the second conductive layer over the overhang and the residue of the sacrificial layer.

5. The method according to claim 3, further comprising selectively removing the second conductive layer over the overhang and the residue of the sacrificial layer.

6. The method according to claim 5, further comprising partially removing the residue of the sacrificial layer.

7. The method according to claim 6, wherein partially removing the residue of the sacrificial layer comprises isotropic etching the residue of the sacrificial layer.

8. The method according to claim 7, wherein isotropic etching comprises combusting the residue of the sacrificial layer.

9. The method according to claim 1, wherein partially removing the sacrificial layer comprises anisotropic etching.

10. The method according to claim 9, wherein anisotropic etching comprises plasma etching.

11. The method according to claim 1, wherein the first and the second conductive layers comprise a polysilicon.

12. A method of manufacturing an EEPROM, the method comprising:
    forming a tunnel oxide over a substrate;
    forming a floating gate over the tunnel oxide, the floating gate having sidewalls and a top surface, wherein a non-conductive overhang is formed along at least one of the sidewalls of the floating gate;
    forming a dielectric on the floating gate;
    forming a sacrificial layer over the dielectric and the non-conductive overhang;
    partially removing the sacrificial layer, wherein a residue of the sacrificial layer remains in an opening beneath the non-conductive overhang;
    forming a control gate on the dielectric; and
    forming source/drain regions in the substrate next to the tunnel oxide.

13. The method according to claim 12, wherein partially removing the sacrificial layer comprises anisotropic etching.

14. The method according to claim 12, wherein the residue of the sacrificial layer is partially removed with isotropic etching.

15. The method according to claim 14, wherein the isotropic etching comprises combusting the residue of the sacrificial layer.

16. The method according to claim 12, wherein the sacrificial layer comprises a carbon containing layer.

17. The method according to claim 12, wherein the floating gate and the control gate comprise polysilicon.

* * * * *